(12) United States Patent
Dautartas et al.

(10) Patent No.: US 6,917,056 B2
(45) Date of Patent: Jul. 12, 2005

(54) OPTOELECTRONIC SUBMOUNT HAVING AN ON-EDGE OPTOELECTRONIC DEVICE

(75) Inventors: Mindaugas F. Dautartas, Blacksburg, VA (US); Dan A. Steinberg, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 217 days.

(21) Appl. No.: 10/066,299

(22) Filed: Jan. 31, 2002

(65) Prior Publication Data

US 2003/0137022 A1 Jul. 24, 2003

Related U.S. Application Data

(60) Provisional application No. 60/265,191, filed on Jan. 31, 2001.

(51) Int. Cl.[7] .............................................. H01L 29/22
(52) U.S. Cl. .............................. 257/98; 257/99; 385/88
(58) Field of Search ...................... 257/98, 99; 385/49, 385/52, 86–88, 92–94

(56) References Cited

U.S. PATENT DOCUMENTS

| | | | |
|---|---|---|---|
| 4,768,199 A | 8/1988 | Heinen et al. | |
| 5,222,175 A | 6/1993 | Tatoh | |
| 5,333,225 A | * 7/1994 | Jacobowitz et al. | .......... 385/93 |
| 5,896,481 A | 4/1999 | Beranek et al. | |
| 5,905,831 A | 5/1999 | Boudreau et al. | |
| 5,909,523 A | 6/1999 | Sakaino et al. | |
| 6,042,276 A | 3/2000 | Tachigori | |
| 6,456,766 B1 | * 9/2002 | Shaw et al. | .................... 385/47 |

* cited by examiner

Primary Examiner—Long Pham
Assistant Examiner—Ginette Peralta
(74) Attorney, Agent, or Firm—Jonathan D. Baskin

(57) ABSTRACT

An optoelectronic submount for providing optical connection and electrical connection to a vertically communicating optical device, such as a vertical cavity surface-emitting laser. The submount has a trench for holding the optoelectronic device on-edge, and electrical connection pits adjoining the trench. A metallization layer is disposed in the electrical connection pits. The electrical connection pits are aligned with the trench and optoelectronic device so that compact pads on the optoelectronic device can be soldered to the metallization layer. A groove can be provided in the submount for holding an optical fiber in alignment with an active area of the optoelectronic device.

35 Claims, 16 Drawing Sheets

US 6,917,056 B2

OPTOELECTRONIC SUBMOUNT HAVING AN ON-EDGE OPTOELECTRONIC DEVICE

RELATED APPLICATIONS

The present application claims the benefit of priority from copending provisional patent application No. 60/265,191 filed on Jan. 31, 2001 and which is hereby incorporated by reference as if set forth in full herein.

FIELD OF THE INVENTION

The present invention relates generally to microoptical devices, and fiber optic communications. More specifically, the present invention relates to an optical submount for holding an optoelectronic chip that communicates in a vertical direction (e.g. a vertical cavity surface emitting laser or photodetector).

BACKGROUND OF THE INVENTION

Optical submounts are needed in the fiber optic industry for optical transmitters, receivers and transmitters. A submount holds microoptical devices in precise alignment. For example, an optical submount can hold an optical fiber and a laser in alignment so that laser light is coupled in the optical fiber.

Typically, lasers used for coupling to optical fibers are edge-emitting lasers. Submounts for coupling an edge-emitting laser to an optical fiber typically comprise a V-groove and the laser disposed at the end of the V-groove. The edge-emitting laser is disposed flat on the submount chip.

Surface emitting or surface detecting devices such as vertical cavity surface emitting lasers or photodetectors require a different geometry. A submount for surface emitting or surface detecting devices ('vertical' devices herein) is needed in the art.

SUMMARY

These objects and advantages are attained by an optical submount comprising a substrate a trench in the substrate, an electrical connection pit adjoining the substrate and a metallization layer in the electrical connection pit. The trench is for holding an optoelectronic device on-edge.

DETAILED DESCRIPTION

The present invention provides an optical submount for vertical optoelectronic devices (e.g. surface emitting or surface detecting devices such as VCSELs). In the present invention, the substrate has a trench and electrical connection pits adjoining the trench. An optoelectronic (OE) device may be disposed in the pit on-edge, so that surfaces of the OE device having contact pads and an active area are perpendicular to a top surface of the substrate. A metal layer is disposed in the electrical connection pits. The electrical connection pits are disposed and shaped so that they are aligned with the contact pads of the OE device.

The substrate may also have a groove (e.g. a V-groove, or a groove with a U-shape or any other shape) that joins the trench. The groove is located on the substrate so that when an OE device is disposed in the trench and soldered to the electrical connection pits, the groove is aligned with the active area of the OE device.

Figure 1:
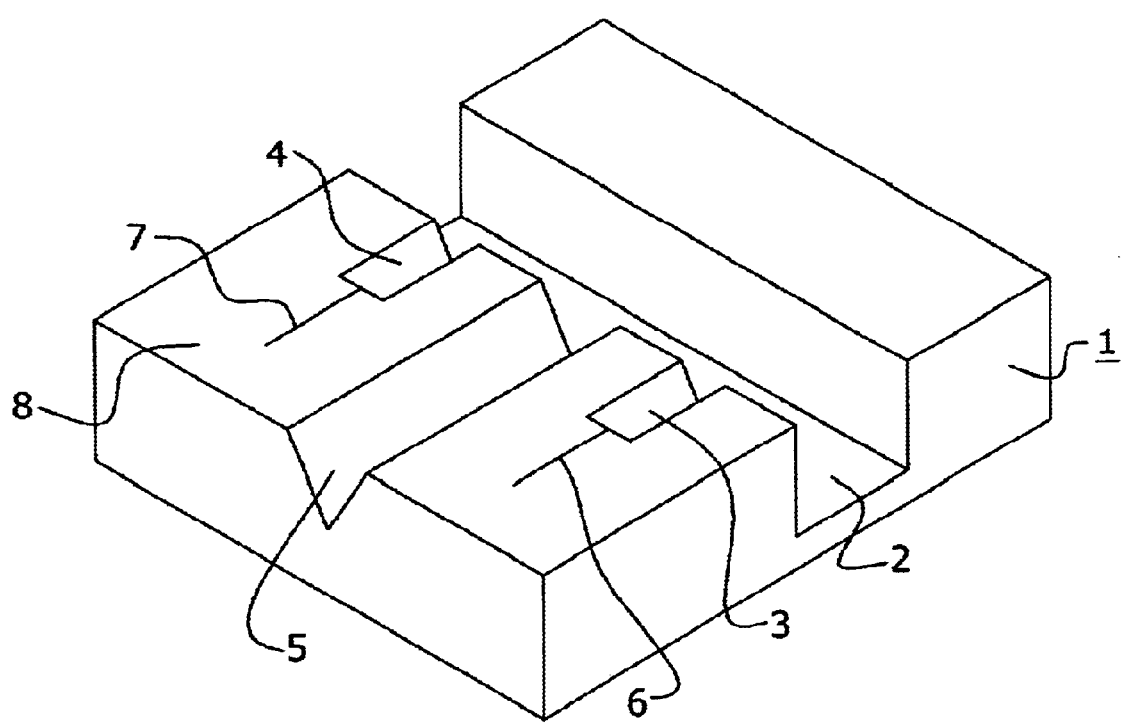
FIG. 1 Shows, a silicon optical bench, also known as a V-Groove or U-Groove chip or a substrate or optical submount, for one embodiment of the invention, comprising a cut trench adapted to receive an optoelectronic device, electrical connection pits, conductive traces, and a V-groove adapted to receive an optical fiber.

Turning now to FIG. 1, the present invention has a V-groove 5 in an optical submount chip 1 with a cut trench 2, transverse to the V-groove 5, and electrical connection pits 3 and 4. The chip 1 can be made of single crystal silicon, the V-groove 5 can be made by anisotropic wet etching, for example by potassium hydroxide etching of (100) silicon, the cut trench 2 can be made by a dicing saw, and the electrical connection pits 3 and 4 can be made by anisotropic wet etching. Conductive traces 6 and 7 can extend from the pits 3 and 4 to a top surface 8 of the chip 1. Note that the etching of the V-Groove 5 may be adjusted to form a truncated V-groove (not shown), known in the art as a U-groove.

Figure 2:
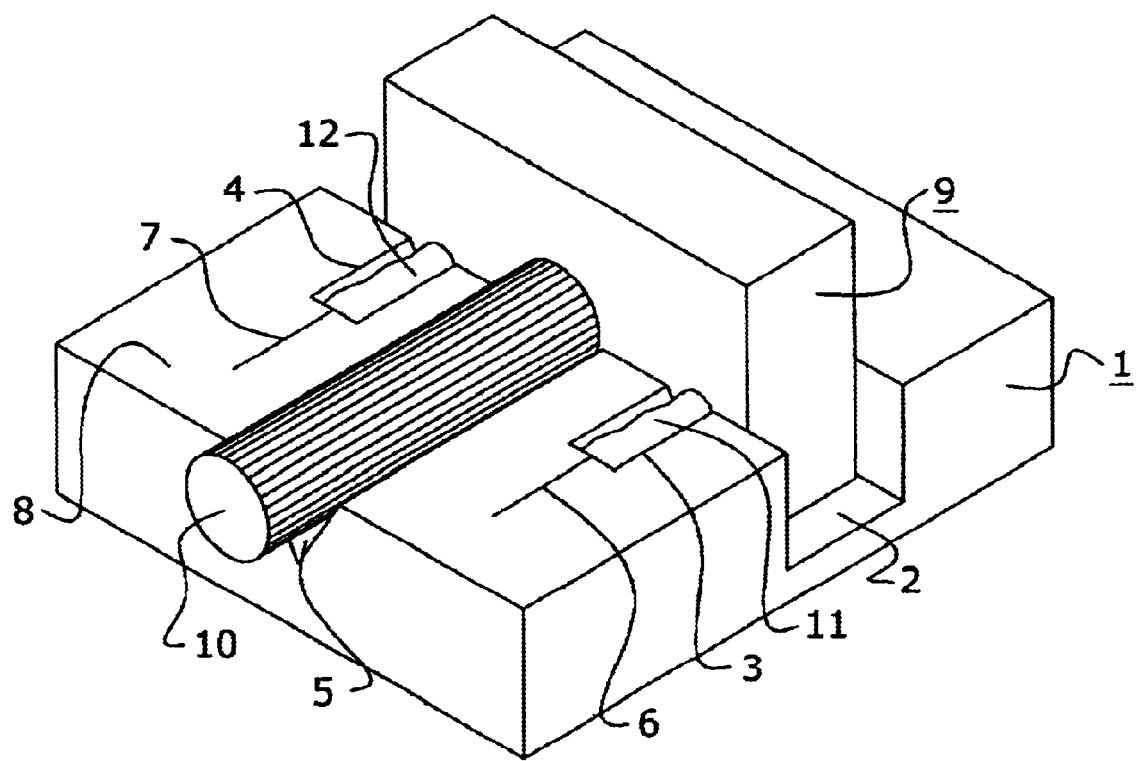
FIG. 2 Shows the silicon optical bench of FIG. 1 further comprising an optical fiber and an optoelectronic device.

Once assembled, a photodetector, laser or other optoelectronic device 9 is disposed in the cut trench 2, as may be seen in FIG. 2. An optical fiber 10 is disposed in the V-groove 5. The electrical contact pits 3 and 4 provide for electrical connections to the optoelectronic device. The pits are filled with solder 11 and 12 that is electrically connected to contact pads 13 and 14 (shown in this FIG. 3) on the optoelectronic device 9. The chip 1, cut trench 2, and optoelectronic device 9 are sized so that an active area 15 of the optoelectronic device is aligned with the optical fiber core (not shown), and so that the contact pads 13 and 14 of the optoelectronic device 9 are aligned with the electrical contact pits 3 and 4

One of the advantages of the present invention is that the endface of the optical fiber (not visible) is very close to the active area 15 of the optoelectronic device 9.

It is noted that the present invention can be used to couple an integrated waveguide to the optoelectronic chip (not shown). This can be accomplished by replacing the optical fiber with an integrated waveguide formed on the silicon chip.

The electrical contact pits 3 and 4 may be filled with solder after the cut trench 2 is made. This is because solder 11 and 12 tends to 'gum up' dicing saw blades.

It is also noted that a ball lens (not shown) can be disposed between the optical fiber 10 and the optoelectronic device 9. A ball lens may require an additional micromachined pit (not shown). A ball lens can focus light from the optical fiber 10 onto the active area 15 of the optoelectronic device 9.

Figure 3:
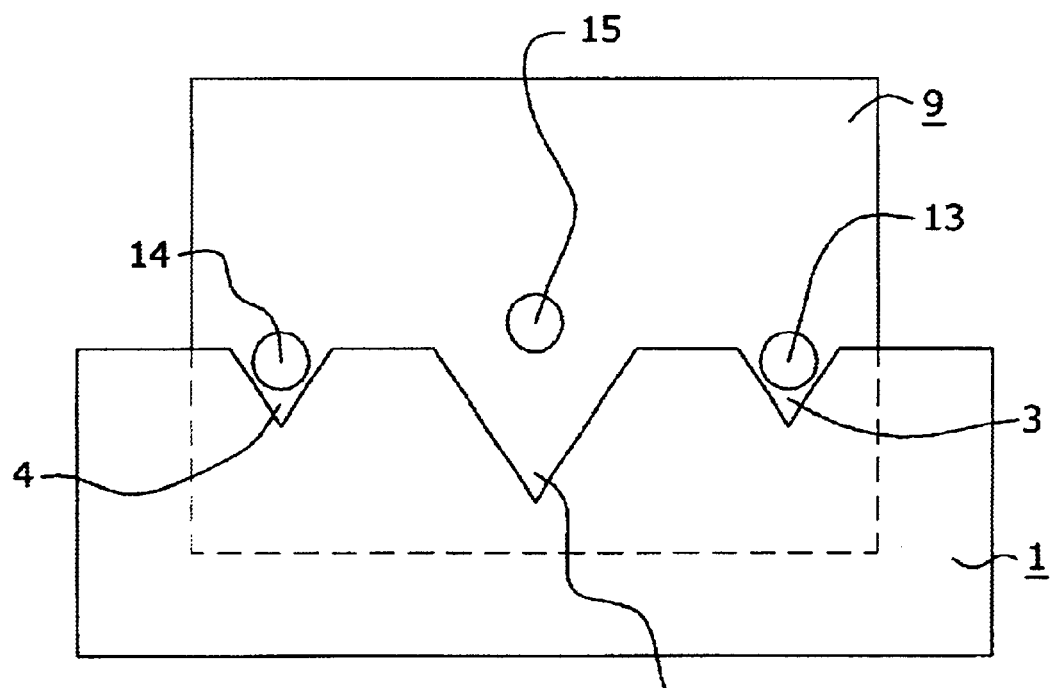
FIG. 3 Shows a front view of the silicon optical bench showing the alignment of an active area, like an emitter or detector, and electrical contact pads of the optoelectronic device, for another embodiment of the invention.

FIG. 3 is a front view of the present invention illustrating the alignment of the chip 1 and the optoelectronic device 9. Note that an advantage of the present invention over the use of simply providing metal traces on the surface of the chip, is that electrical contact pits 3 and 4 may be made at different depths (not shown), to accommodate non-coplanar contact pads 13 and 14. Alternatively, varying contact pad heights may be accommodated with the use of one or more pits in conjunction with metal traces on the surface (not shown). Another advantage, is that that there is greater contact area between the edge of the solder 4 and 11 with the contact pads 13 and 14, providing a lower resistance electrical connection than would be had with the edge of a trace and a contact pad, and a lower thermal resistance path to provide better heat sinking. Optionally, the electrical contact pits 3 and 4 can be as deep or deeper than the V-groove 5 for the optical fiber 10.

Figure 4:
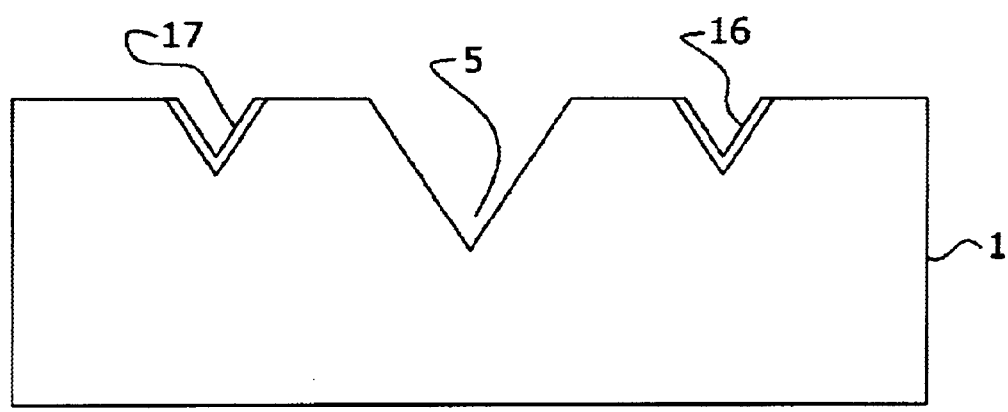
FIG. 4 Shows metallization, adapted to be soldered, over the surface of the electrical contact pits, for another embodiment of the invention.
Figure 5:
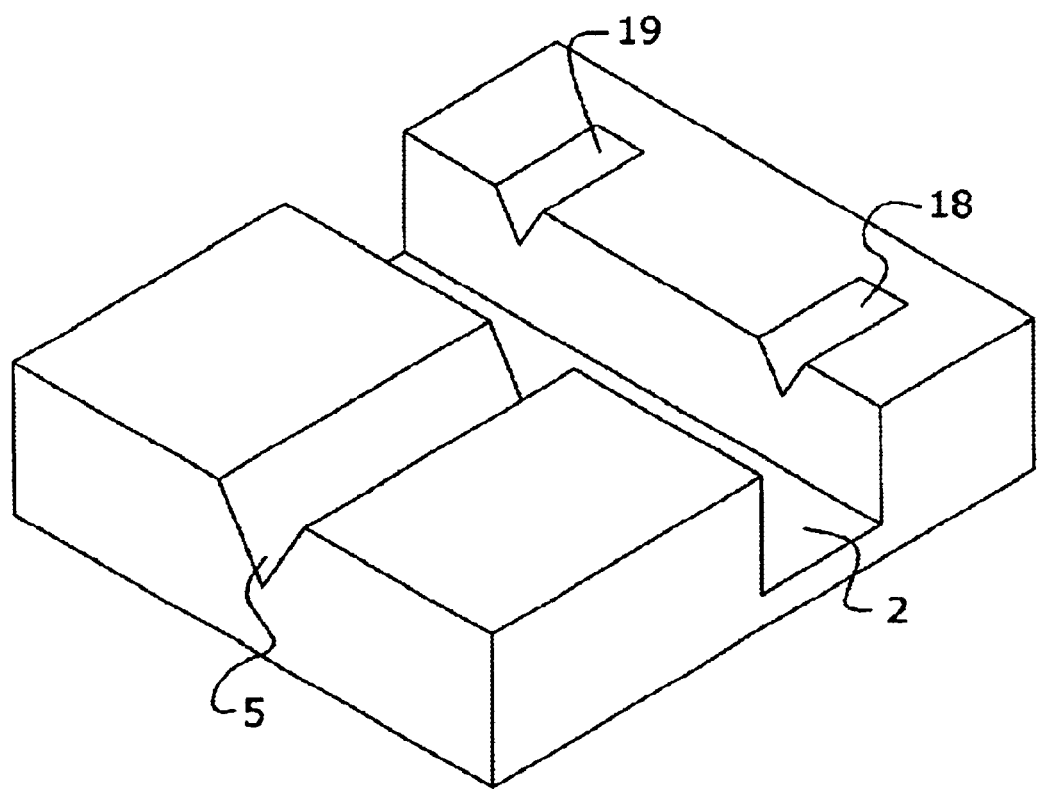
FIG. 5 Shows electrical contact pits located opposite the V-groove, in another embodiment of the invention.

It is desirable that the electrical contact pits should be metallized 16 and 17, as shown in FIG. 4, so that they can be wetted and filled with solder In an alternative embodiment of the invention, one or both of the electrical contact pits 18 and 19 are located opposite the V-groove 5, as can be seen in FIG. 5.

The optoelectronic subassemblies of the present invention can be packaged by bonding a lid to the V-groove 5 containing chip 1. The lid can hermetically seal the optoelectronic device 9 (not shown).

Another aspect of the invention, further comprises a preform having bumps, or a via structure, with or without a step, (not shown).

Figure 6:
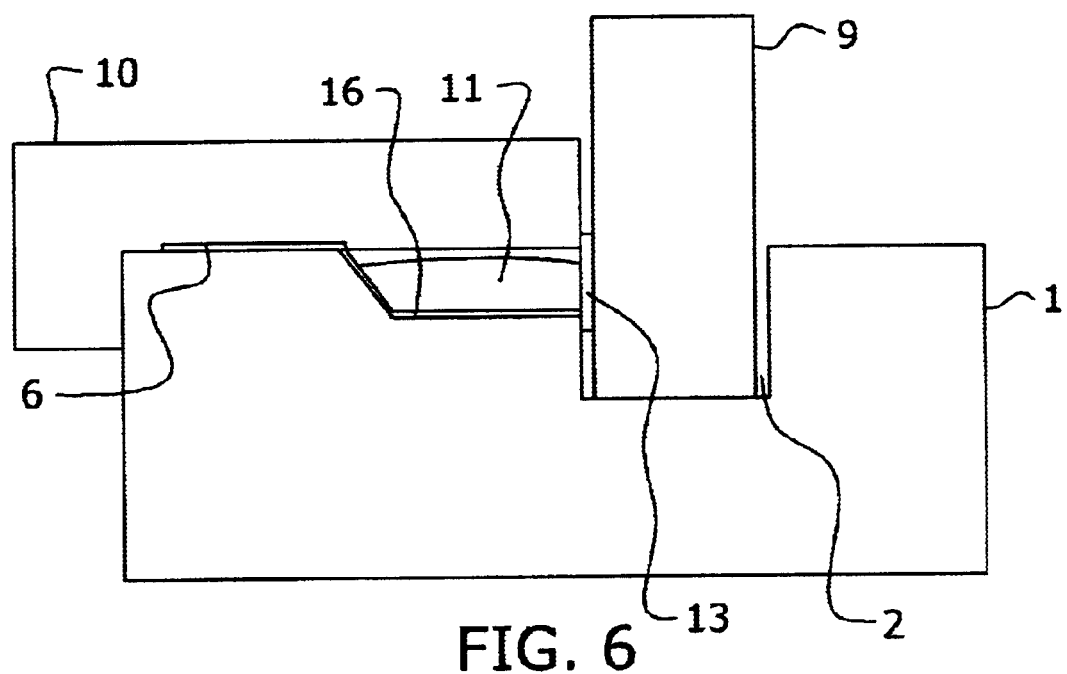
FIG. 6 Shows a side view illustrating electrical connection between the electrical contact pits and the optoelectronic device.

FIG. 6 is a cross-section view of FIG. 2, illustrating the electrical connection between the pits 3 and 4 and the optoelectronic device 9.

Figure 7:
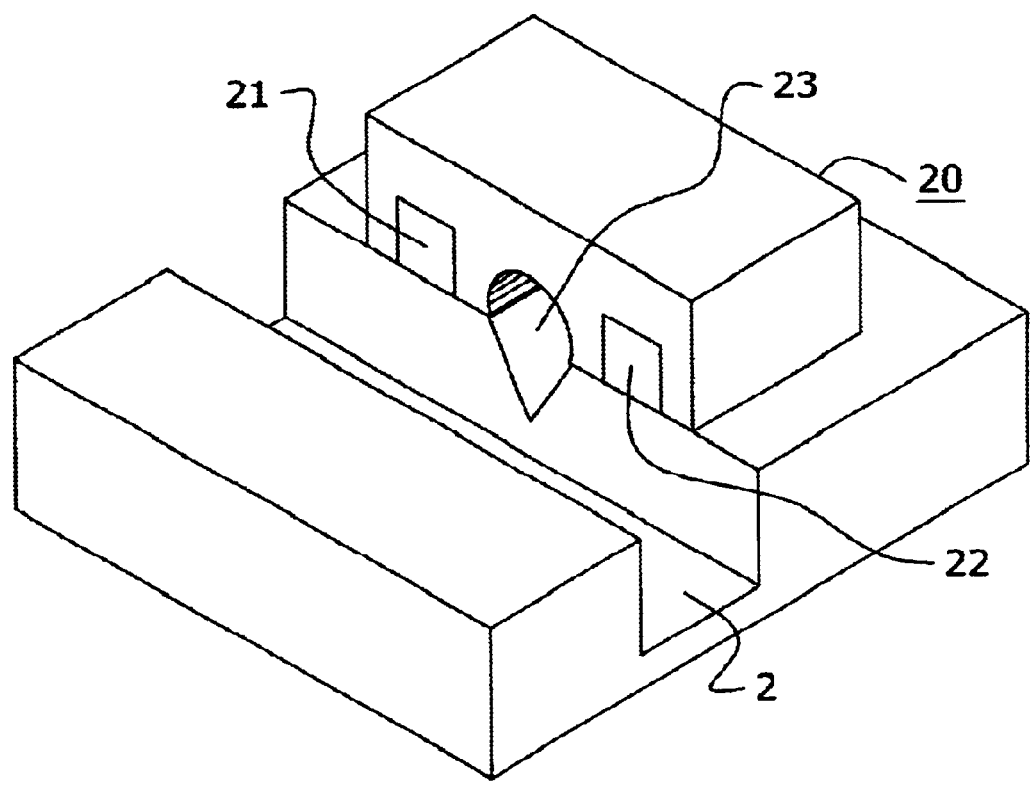
FIG. 7 Shows a ceramic or semiconductor part with metal interconnections and a recess area, the part being mounted over the V-groove, in another embodiment of the invention.

In an alternative embodiment of the present invention, a ceramic or semiconductor connector 20 with embedded electrical conductors 21 and 22 is used to provide electrical contacts to the optoelectronic device 9, as can be seen in FIG. 7. The connector has a recess 23 for accommodating the optical fiber 10. The embedded electrical conductors 21 and 22 may comprise metal, doped polysilicon, silicides and the like.

Figure 8:
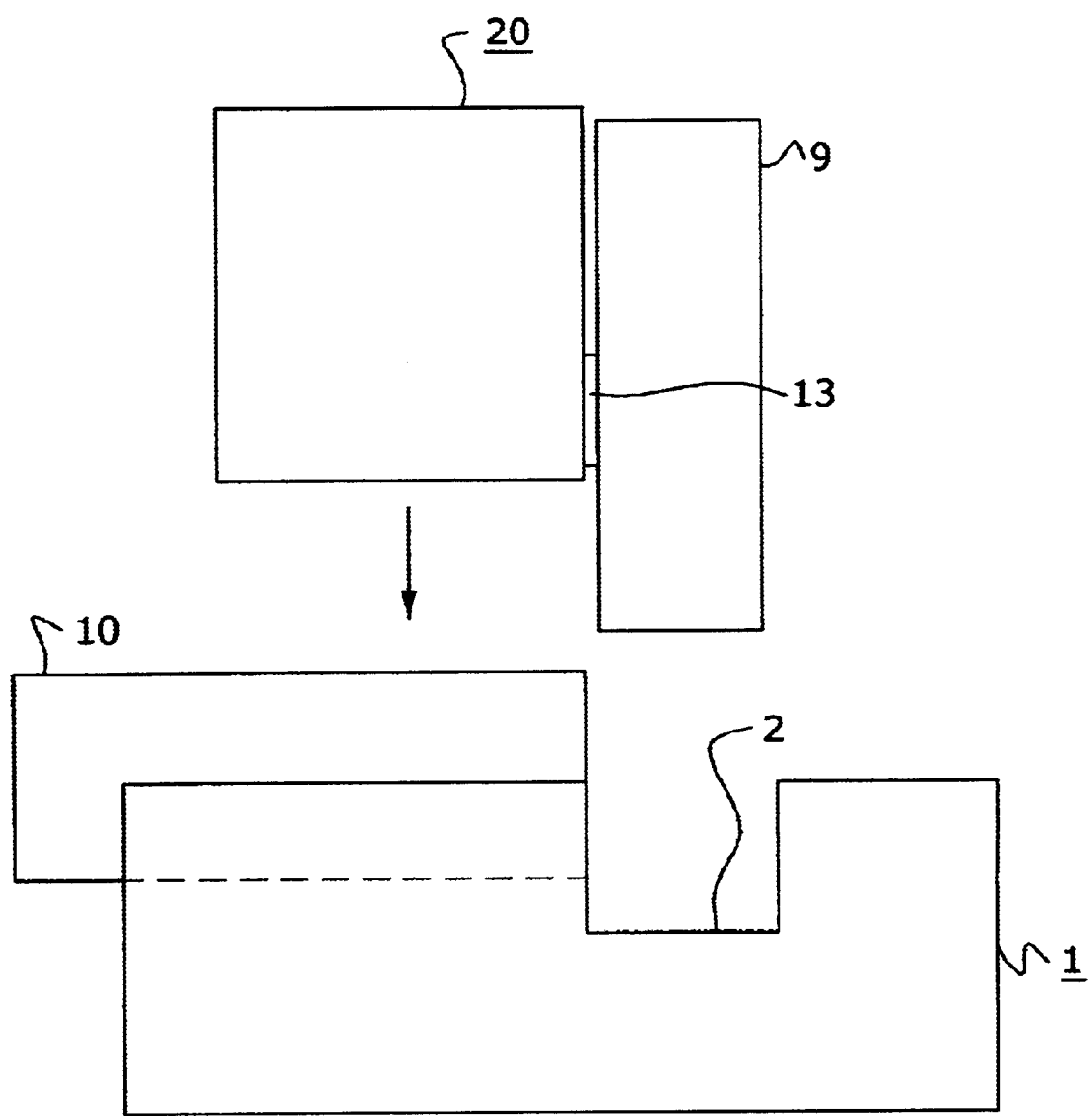
FIG. 8 Shows a method for assembling the ceramic or semiconductor part to the silicon optical bench.
Figure 9:
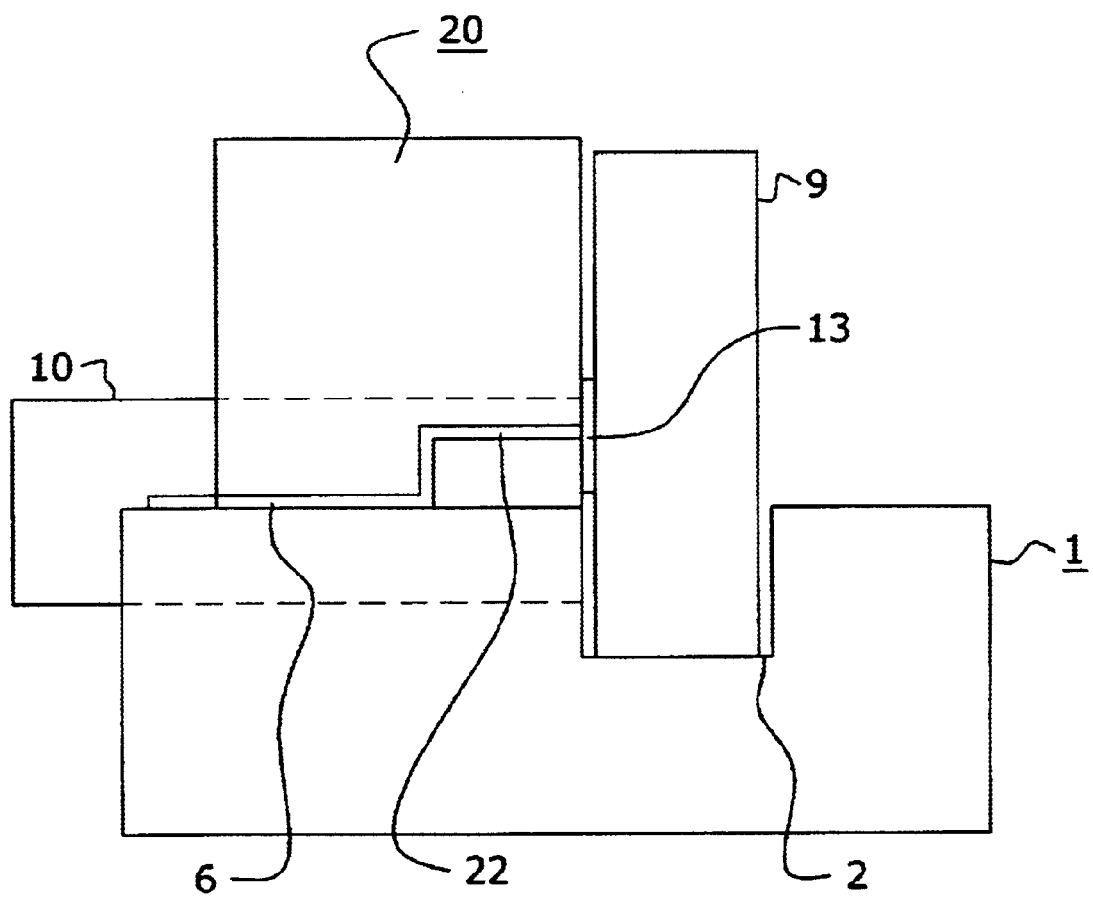
FIG. 9 Shows a cross section of FIG. 8 after assembly.

FIG. 8 is a side view showing a possibility for how to assemble the connector 20 into the submount 1. The connector 20 and optoelectronic device 9 are bonded before they are bonded to the chip 1. The connector 20 can be soldered to electrical contact pits 3 and 4 on chip 1 or to traces 6 and 7. The fiber 10 and optoelectronic device 9 can be aligned by positioning the connector 20 on the chip 1 prior to bonding. FIG. 9 shows a cross section of the assembly of FIG. 8.

Figure 10:
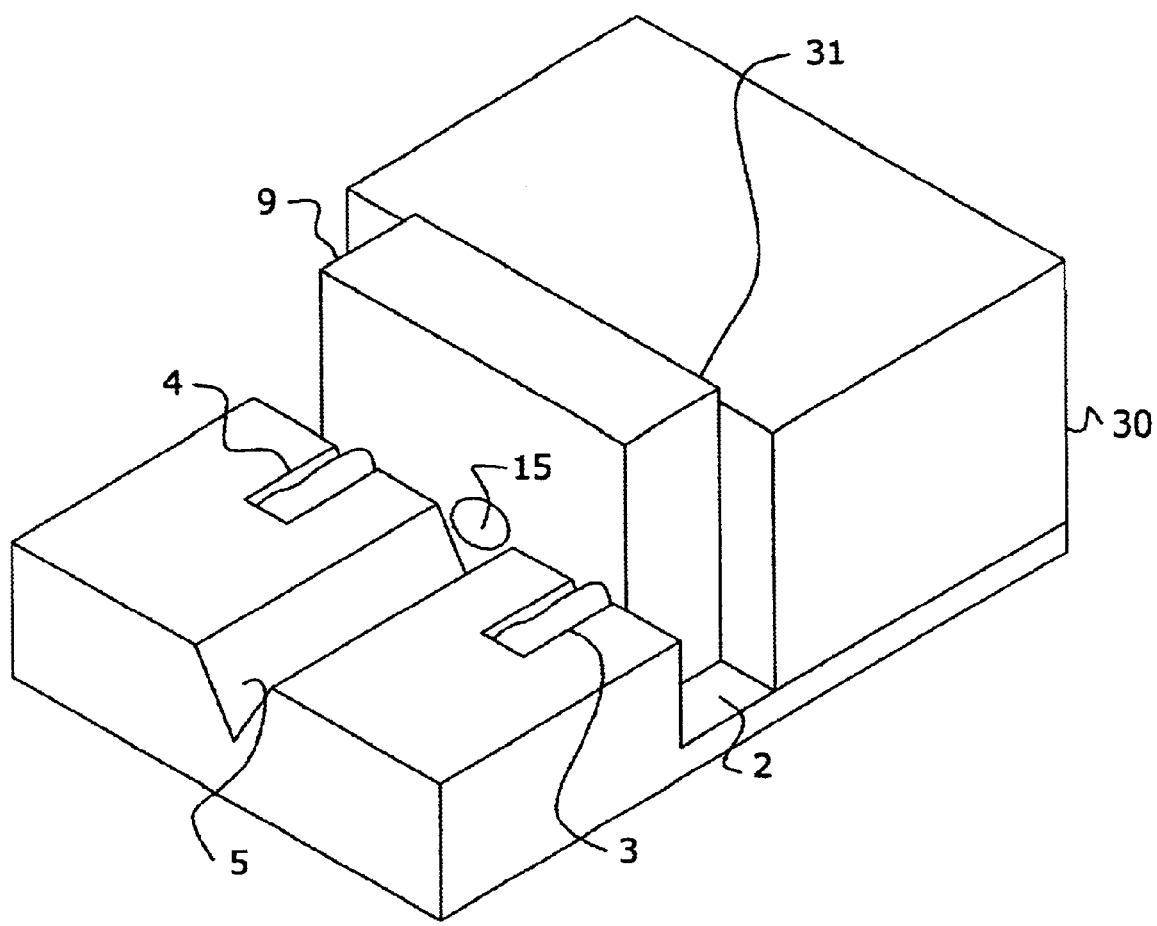
FIG. 10 Shows an embodiment further comprising a heat sink.
Figure 11:
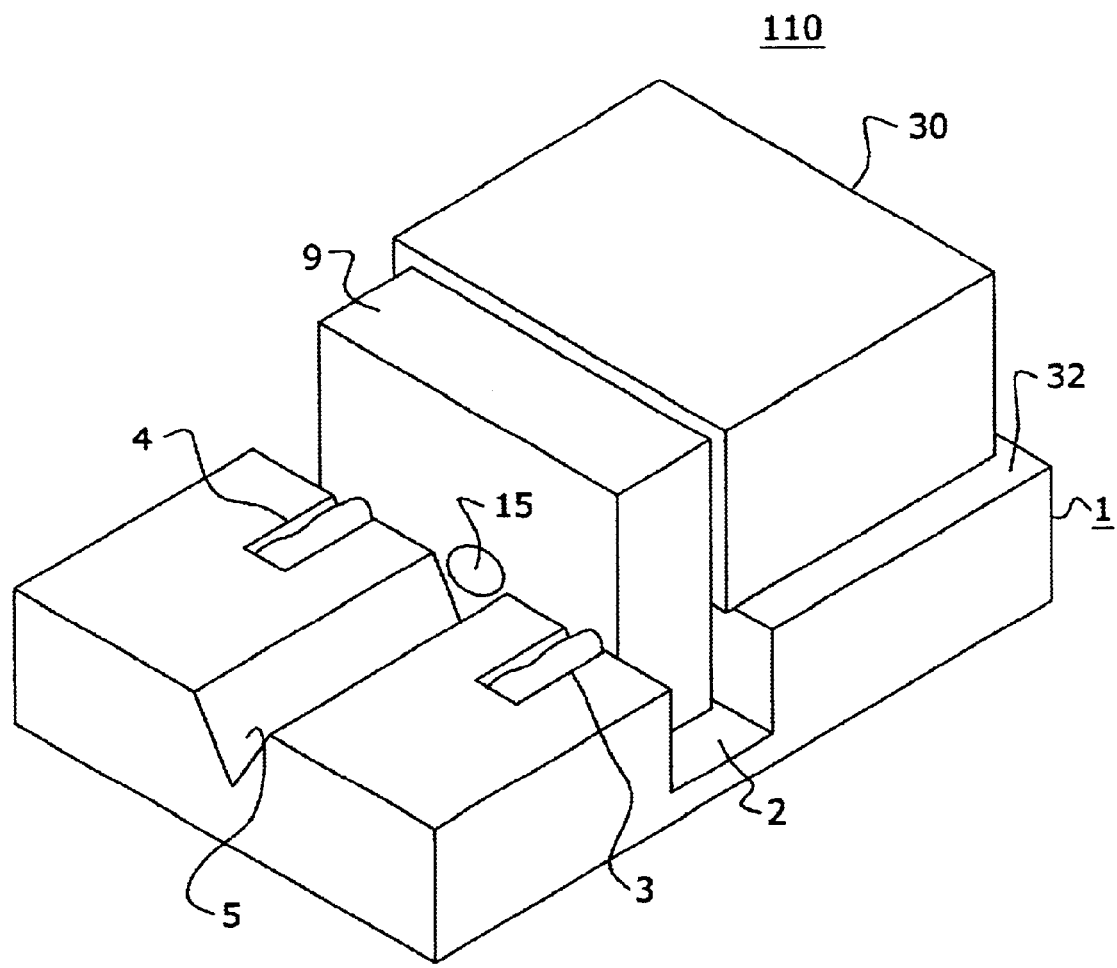
FIG. 11 Shows another embodiment further comprising a heat sink.

In another embodiment of the present invention, a heat-conductive block 30 (e.g. copper, BeO, diamond, silicon, Kovar, molybdenum, aluminum nitride, silicon carbide) is disposed in contact with a back side 31 of the optoelectronic device 9, as may be seen in FIG. 10. Heat-sinking can be important if the optoelectronic device is a laser.

In the specific embodiment shown in FIG. 10, chip 1 is cut-away under the heat sink 30 so that the heat sink 30 has a large contact area with the optoelectronic device 9.

In another embodiment, the heat sink 30 is disposed on a top surface 32 of chip 1. The package 110 with the heat sink 30 can have a lid, preform or via structure (not shown).

It is noted that, in some designs, it may be desirable to locate the contact pads on the optoelectronics device 9 on the back side of the device 9, and, consequently, locate the electrical contact pits below the heat sink 30 (not shown). In this case, all the electrical and mechanical connections to the optoelectronic (OE) device 9 are disposed on the same side, thereby minimizing the mechanical stress on the OE device 9 due to thermal expansion.

In another embodiment, the OE device has one electrical contact one each side (not shown). In this case, the heat sink 30 can provide one electrical connection. The heat sink 30 can be made out of metal.

Figure 12:
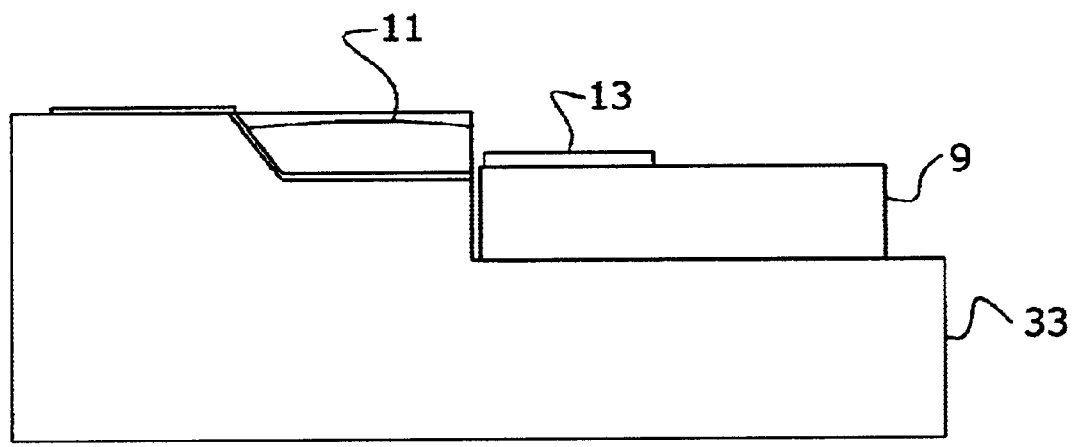
FIGS. 12 and 13 Show the use of surface tension to attach the optoelectronic bench to the silicon optical bench.
Figure 13:
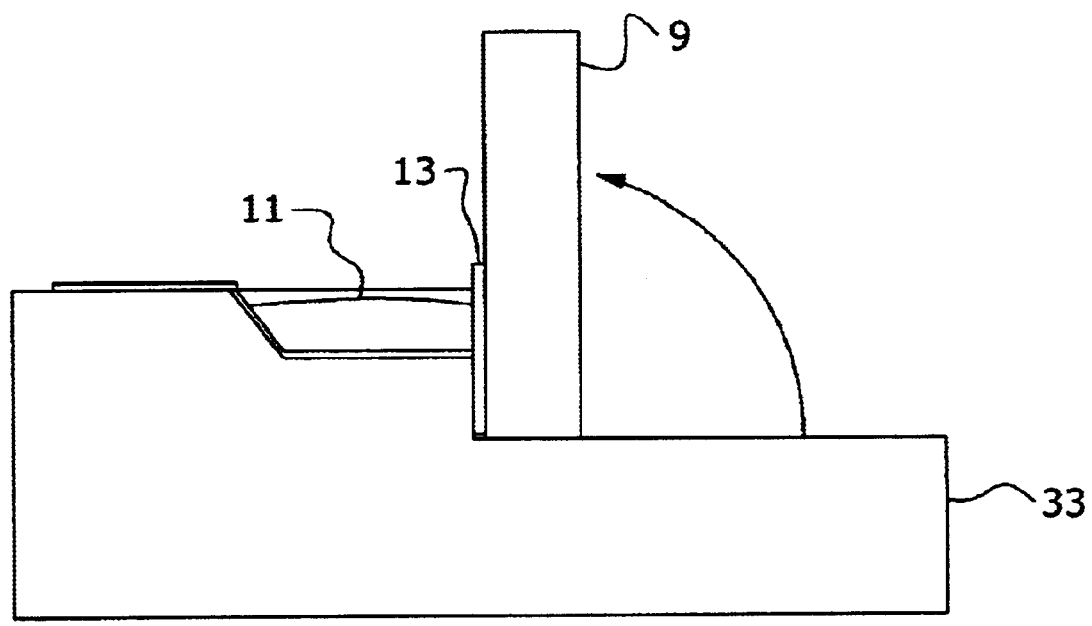

In one embodiment of the invention, a 'tombstone effect' is used to cause the optoelectronic chip to stand on its edge. The starting position is seen in FIG. 12. The optoelectronic device 9 is placed flat on an optical submount chip 33. The solder 11 is reflowed. Surface tension forces from wetting contact pad 13 (and 14) cause the optoelectronic device 9 to stand on its edge.

Figure 14:
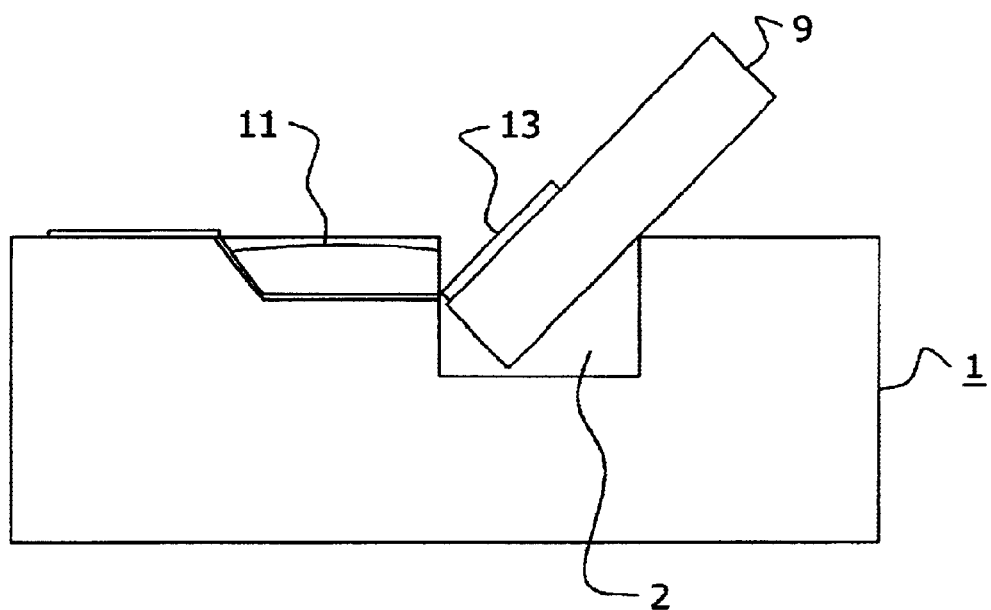
FIGS. 14 and 15 Show the use of surface tension to attach the optoelectronic bench to the silicon optical bench, wherein the optoelectronic device is first positioned at an angle.
Figure 15:
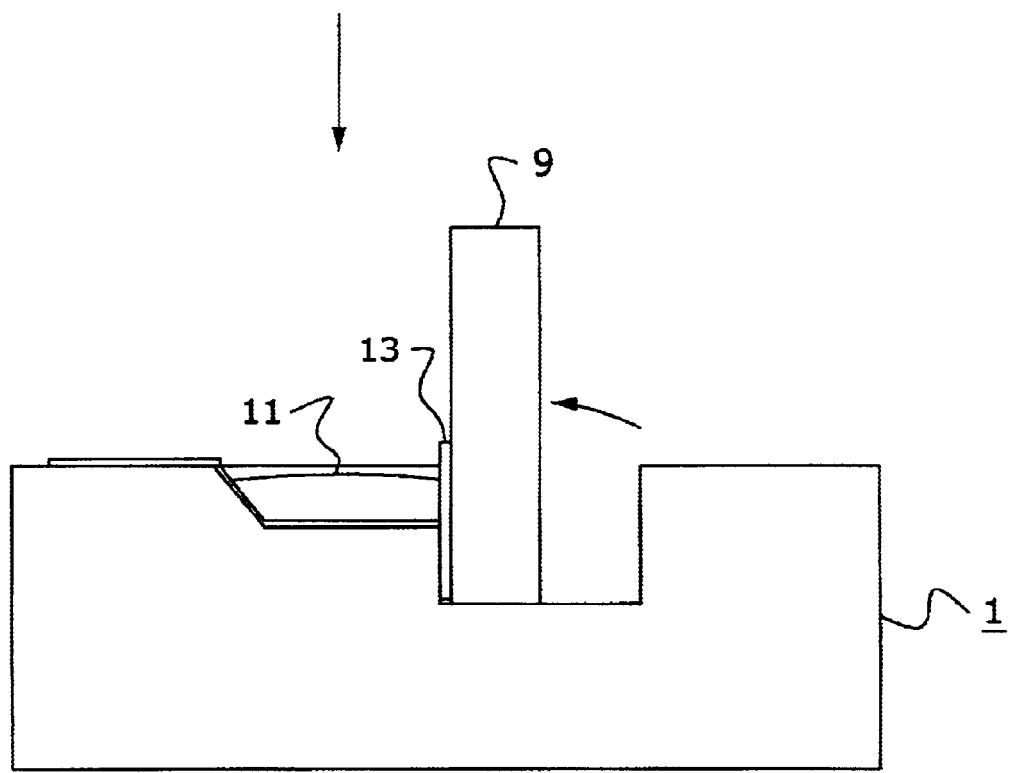

Also, the optoelectronic device 9 can be set at an angle, as may be seen in FIG. 14. After solder reflow, the optoelectronic device 9 is flipped onto its edge.

Figure 16:
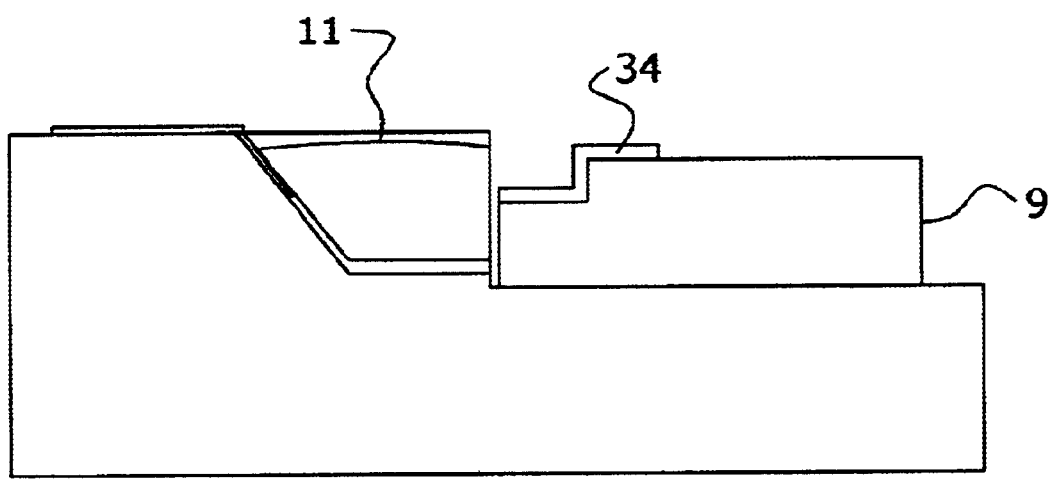
FIG. 16 Shows an optoelectronic device with a stepped metallized edge, to assist in surface tension positioning.
Figure 17:
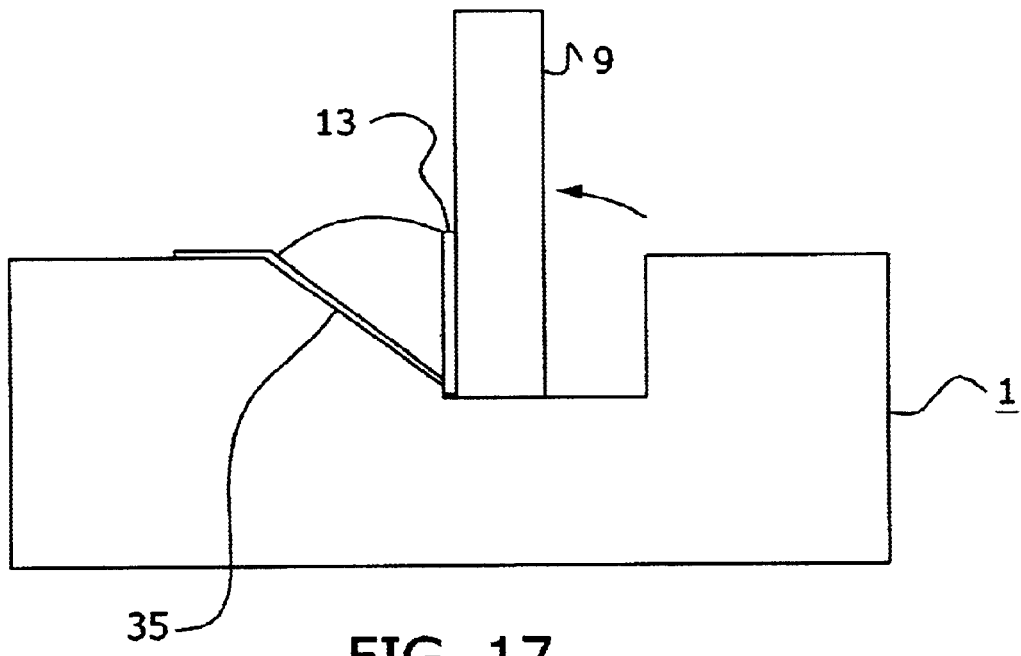
FIG. 17 Shows a sloped electrical contact pit, in yet another embodiment of the invention.
Figure 18:
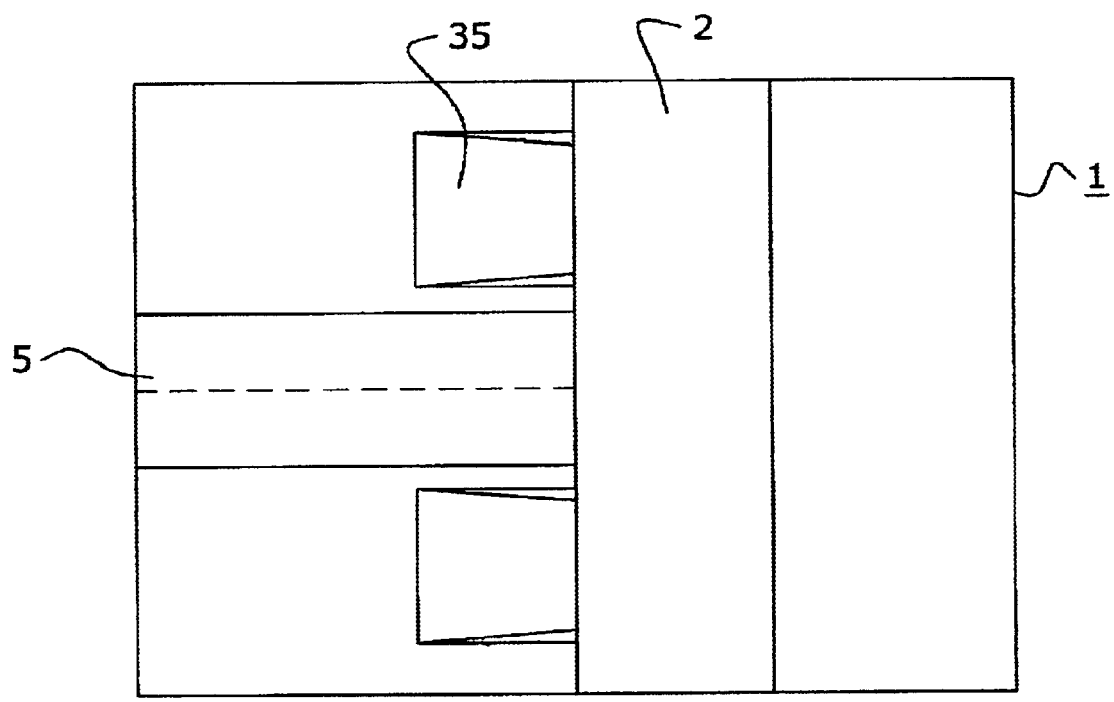
FIG. 18 Shows a top view of FIG. 15, without the optoelectronic device.

Also, to aid the tombstone effect, the optoelectronic device 9 can have a stepped edge that is metallized 34, as may be seen in FIG. 16. Also, the electrical contact pit can be very deep, for example, as deep as the saw cut (not shown). It is also noted that the electrical contact pit 35 can have a sloped shape as shown in FIG. 17 and the top view of FIG. 17, which is FIG. 9 (not including the optoelectronic device 9). Note that the contact pads 13 and 14 may be designed with a shape, such as a shape matching the cross section of the electrical contact pits 3 and 4, that causes self alignment of the optoelectronic device 9 to the optical fiber 10, with or without the aid of the tombstone effect.

Figure 19:
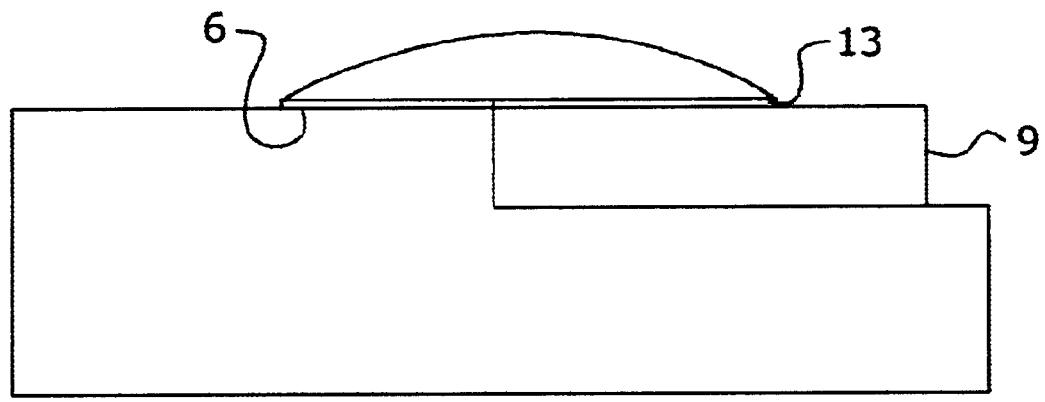
FIG. 19 shows an embodiment in which an optoelectronic device is to be flipped vertically by solder surface tension forces.
Figure 20:
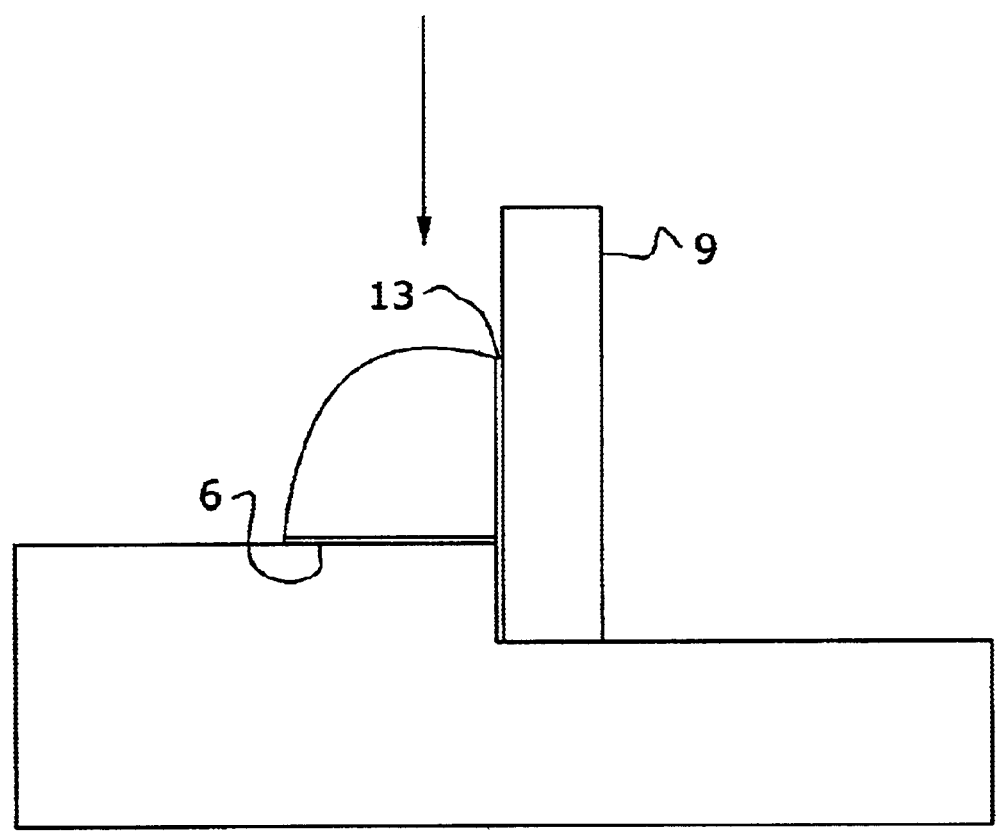
FIG. 20 shows the device of FIG. 19 after the optoelectronic device is flipped vertically.

In another aspect of the invention, electrical contact pits are not used. In this case, the optoelectronic device can be flipped vertically by surface tension forces from the solder, as may be seen in FIGS. 19 and 20.

Figure 21:
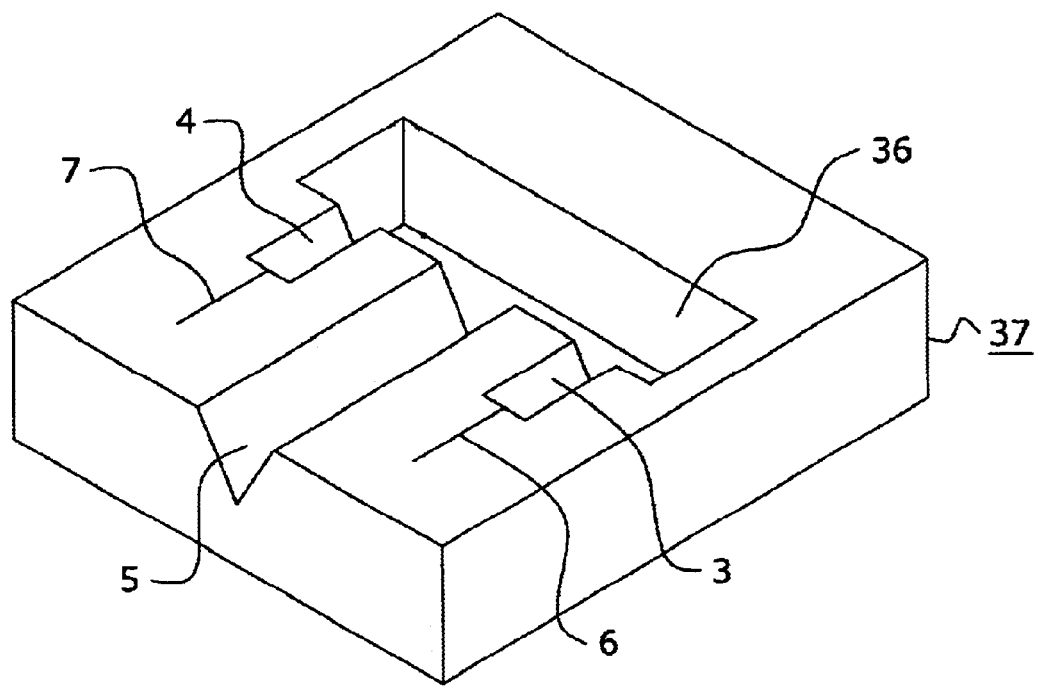
FIG. 21 shows an embodiment wherein the trench does not extent to the end of the substrate.
Figure 22:
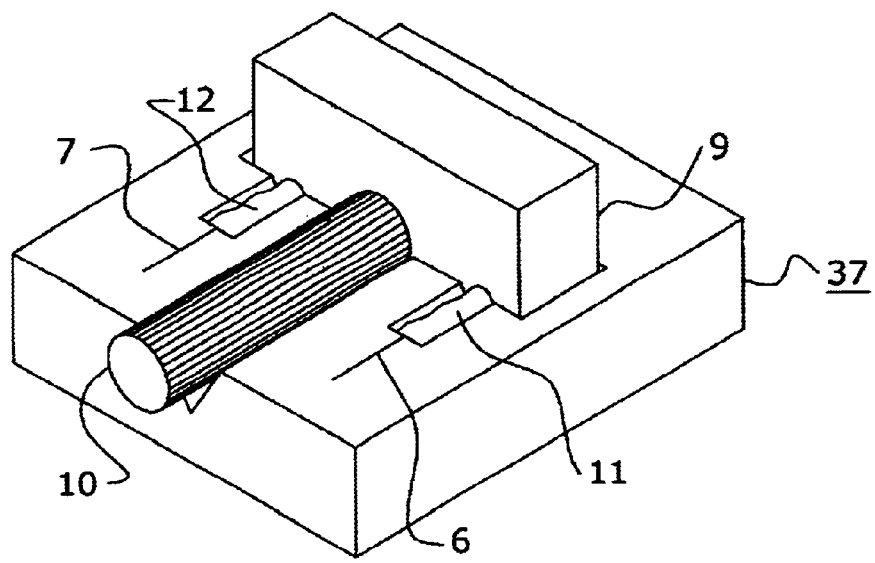
FIG. 22 shows an optoelectronic device inserted into the trench of FIG. 21.
Figure 23:
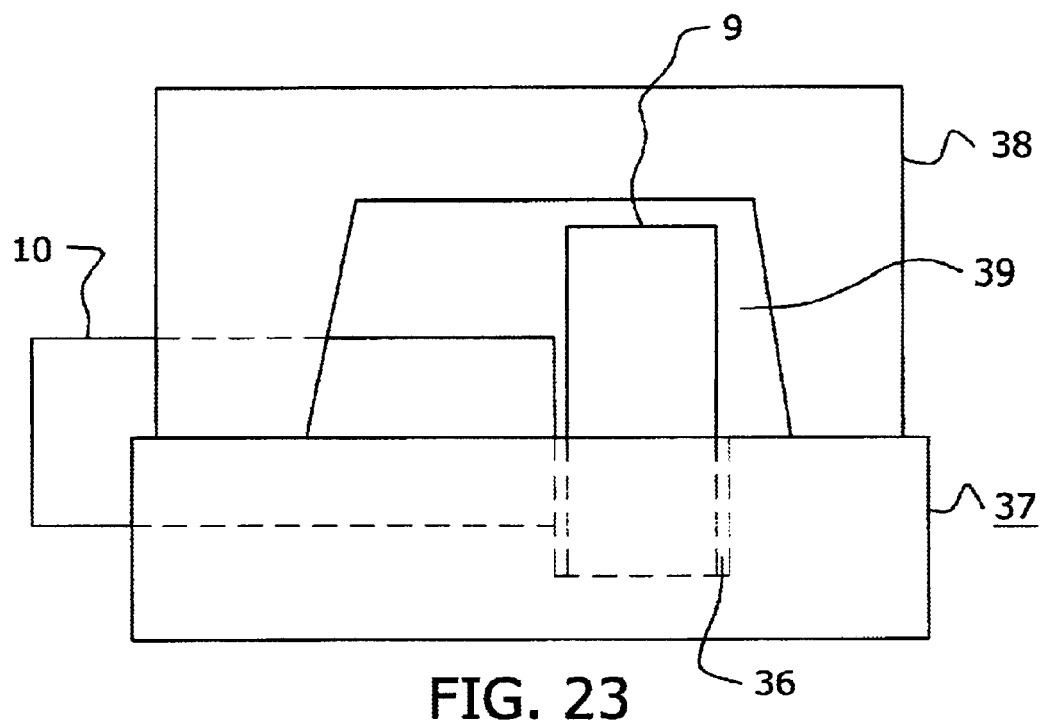
FIG. 23 is a side view of FIG. 22, further comprising a lid chip.
Figure 24:
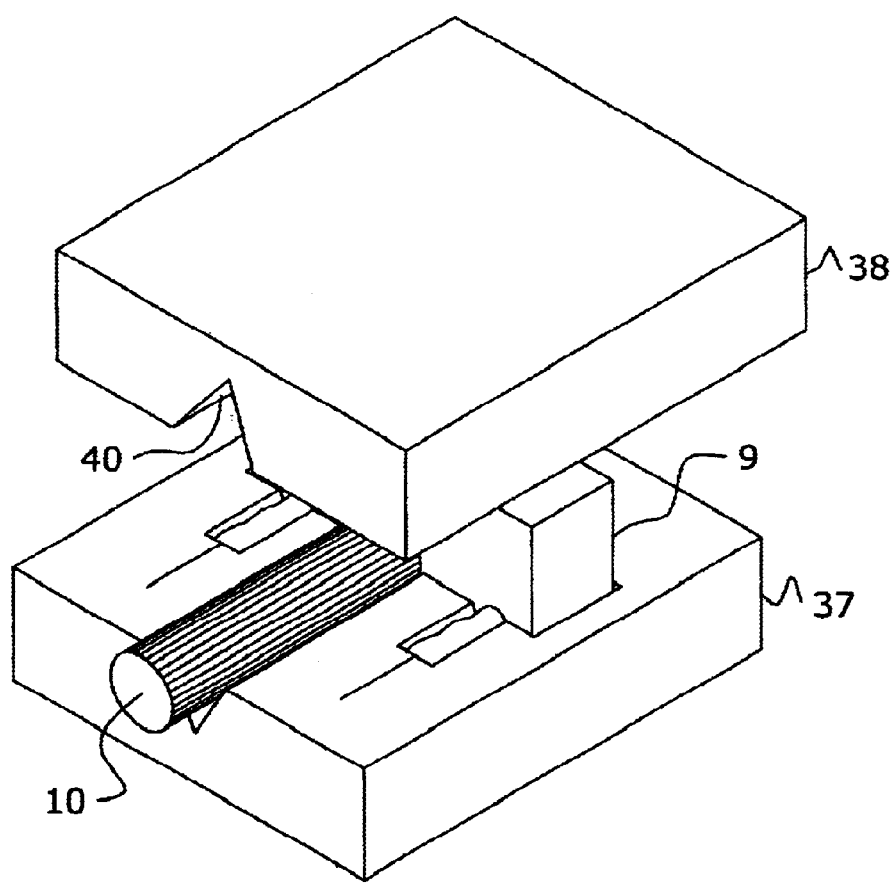
FIG. 24 is a perspective view of the assembly described in FIG. 23, showing a groove in the lid chip, the groove adapted to accommodate an optical fiber.

FIG. 21 shows a trench 36 that does not extend to edges of substrate 37. This feature may be used to make hermetic devices. The trench may be formed directional dry etching, such as deep reactive ion etching. As shown in FIG. 21, an optoelectronic device 9 is inserted into trench 36. A lid 38 may then be disposed on the substrate 37, as can be seen in FIG. 23. The lid 38 may have an etched area 39, to accommodate optoelectronic device 9. The optoelectronic subassemblies of the present invention can be packaged by bonding a lid 38 to the substrate 37. The lid 38 can hermetically seal the optoelectronic device 9 (not shown) by boding the perimeter of the lid 38 to the substrate 37 using, for example, solder or glass frit. The lid materials include single crystal silicon, ceramic, low-expansion metal and the like. The lid 37 may further comprise a groove 40, for accommodating fiber 10, as can be seen in FIG. 24.

It will be clear to one skilled in the art that the above embodiment may be altered in many ways without departing from the scope of the invention. Accordingly, the scope of the invention should be determined by the following claims and their legal equivalents.

What is claimed is:

1. An optical submount comprising:
   a) a substrate;
   b) a trench in the substrate for holding an optoelectronic device on-edge;
   c) an electrical connection pit adjoining the trench; and
   d) a metallization layer in the electrical connection pit.
2. The optical submount of claim 1 further comprising a groove in the substrate adjoining the trench.
3. The optical submount of claim 2 further comprising an optical fiber disposed in the groove.
4. The optical submount of claim 2 wherein the groove is adjacent to the electrical connection pit.
5. The optical submount of claim 2 wherein the groove is perpendicular to the trench.
6. The optical submount of claim 2 wherein the groove and electrical connection pit are disposed on opposite sides of the trench.
7. The optical submount of claim 1 further comprising an optoelectronic device disposed in the trench.
8. The optical submount of claim 7 wherein the optoelectronic device includes a contact pad, and the contact pad is soldered to the metallization layer.
9. The optical submount of claim 7 further comprising a groove in the submount aligned with an active area of the optoelectronic device.
10. The optical submount of claim 1 comprising two electrical connection pits.
11. The optical submount of claim 10 wherein the two electrical connection pits have different depths.
12. The optical submount of claim 10 wherein the two electrical connection pits are disposed on the same side of the trench.
13. The optical submount of claim 1 wherein the electrical connection pit is at least partially filled with solder.
14. The optical submount of claim 1 wherein the trench is a trench formed by a dicing saw.
15. The optical submount of claim 1 wherein the trench is a trench formed by directional dry etching.
16. The optical submount of claim 1 wherein the substrate comprises <100> silicon, and the electrical connection pit is an anisotropically wet etched pit.
17. The optical submount of claim 1 further comprising a lid disposed over the substrate.
18. The optical submount of claim 1 further comprising an optical waveguide disposed on the substrate, and terminating at the trench.
19. The optical submount of claim 1 wherein the trench does not extend to an edge of the substrate.
20. An optical device, comprising:
    a) a substrate;
    b) a trench in the substrate;
    c) an electrical connection pit adjoining the trench;
    d) a metallization layer in the electrical connection pit; and
    e) an optoelectromc device disposed on-edge in the trench, wherein the optoelectronic device has a contact pad soldered to the metallization layer.
21. The optical device of claim 20 further comprising a groove in the substrate adjoining the trench.
22. The optical device of claim 21 further comprising an optical fiber disposed in the groove.
23. The optical device of claim 21 wherein the groove is perpendicular to the trench.
24. The optical device of claim 21 wherein the groove and electrical connection pit are disposed on opposite sides of the trench.
25. The optical device of claim 21 wherein the groove is aligned with an active area of the optoelectronic device.
26. The optical device of claim 20 wherein the trench is a trench formed by a dicing saw.
27. The optical device of claim 20 wherein the trench is a trench formed by directional dry etching.
28. The optical device of claim 20 wherein the substrate comprises <100> silicon, and the electrical connection pit is an anisotropically wet etched pit.
29. The optical device of claim 20 further comprising a lid disposed over the substrate.
30. The optical device of claim 20 further comprising an optical waveguide disposed on the substrate, and terminating at the trench.
31. The optical device of claim 20 wherein the trench does not extend to an edge of the substrate.
32. The optical device of claim 29 wherein the substrate and the lid comprise silicon, and the lid hermetically seals the optical device.
33. The optical device of claim 20, wherein the optoelectronic device is a surface emitting or detecting device.
34. The optical device of claim 20, wherein the optoelectronic device has an optical plane in a direction parallel to the surface of the substrate in which the trench is formed.
35. An optical device, comprising:
    a) a substrate;
    b) a trench in the substrate;
    c) an electrical connection pit adjoining the trench;
    d) a metallization layer in the electrical connection pit; and
    e) an optoelectronic device disposed on-edge in the trench and electrically connected to the metallization layer.

* * * * *